United States Patent
Wu et al.

(10) Patent No.: US 11,935,925 B2
(45) Date of Patent: Mar. 19, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Gongyi Wu, Hefei (CN); Youquan Yu, Hefei (CN); Yong Lu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 371 days.

(21) Appl. No.: 17/444,070

(22) Filed: Jul. 30, 2021

(65) Prior Publication Data
US 2022/0013644 A1    Jan. 13, 2022

Related U.S. Application Data

(63) Continuation of application No. PCT/CN2021/095570, filed on May 24, 2021.

(30) Foreign Application Priority Data

Jul. 10, 2020  (CN) .......................... 202010663904.8

(51) Int. Cl.
  H01L 29/40   (2006.01)
  H01L 21/28   (2006.01)
  H01L 29/49   (2006.01)

(52) U.S. Cl.
  CPC ...... H01L 29/401 (2013.01); H01L 21/28247 (2013.01); H01L 29/49 (2013.01)

(58) Field of Classification Search
  CPC . H01L 29/401; H01L 21/28247; H01L 29/49; H01L 21/28061; H01L 29/4941; H01L 29/4983
  See application file for complete search history.

(56) References Cited

U.S. PATENT DOCUMENTS 6,617,624 B2  9/2003  Powell
7,087,508 B2  8/2006  Cheng
(Continued)

FOREIGN PATENT DOCUMENTS

CN    1619776 A      5/2005
KR    20090104252 A  10/2009
(Continued)

OTHER PUBLICATIONS

Supplementary European Search Report in the European application No. 21802178.0, dated Jul. 27, 2022.
(Continued)

*Primary Examiner* — Thanh Y. Tran
(74) *Attorney, Agent, or Firm* — Syncoda LLC; Feng Ma

(57) ABSTRACT

A method for manufacturing a semiconductor structure includes the following operations. A first conductive layer, a second conductive layer and a passivation layer are successively formed on a semiconductor substrate. The passivation layer and the second conductive layer are patterned to form a primary gate pattern. A portion of the first conductive layer that is not covered by the primary gate pattern, is exposed. The primary gate pattern is subjected with plasma treatment to form a first protective layer. A dielectric layer is formed. The exposed portion of the first conductive layer is removed to retain a portion of the first conductive layer covered by the primary gate pattern. A second protective layer is formed on a side wall of the exposed portion of the first conductive layer.

18 Claims, 14 Drawing Sheets

(56) References Cited

U.S. PATENT DOCUMENTS

| | | |
|---|---|---|
| 2003/0228766 A1 | 12/2003 | Chou |
| 2004/0266182 A1* | 12/2004 | Ku ................... H01L 21/28518 |
| | | 257/E21.199 |
| 2007/0114616 A1* | 5/2007 | Manger ............... H01L 21/2815 |
| | | 257/407 |
| 2008/0213990 A1 | 9/2008 | Oh |
| 2010/0035425 A1 | 2/2010 | Ryu |
| 2012/0282769 A1 | 11/2012 | Ryu |

FOREIGN PATENT DOCUMENTS

| | | |
|---|---|---|
| KR | 20090105444 A | 10/2009 |
| KR | 20100003833 A | 1/2010 |
| KR | 20130082374 A | 7/2013 |

OTHER PUBLICATIONS

International Search Report in the international application No. PCT/CN2021/095570, dated Aug. 23, 2021.
S. Kal etal, "Selective isotropic etching of Group IV semiconductors to enable gate all around device architectures", TEL Technology Center, America, LLC, USA, SPCC, Apr. 10, 2018.

* cited by examiner

METHOD FOR MANUFACTURING SEMICONDUCTOR STRUCTURE AND SEMICONDUCTOR STRUCTURE

CROSS-REFERENCE TO RELATED APPLICATIONS

This application is a continuation of International Application No. PCT/CN2021/095570 filed on May 24, 2021, which claims priority to Chinese Patent Application No. 202010663904.8 filed on Jul. 10, 2020. The disclosures of these applications are hereby incorporated by reference in their entirety.

BACKGROUND

With the increase in the integration level of semiconductor devices, it is usually to manufacture a Dynamic Random-Access Memory (DRAM) with a gigabit storage capacity. In order to reduce the Resistance-Capacitance (RC) delay in a gate of a device, it is usually to use a metal/polysilicon gate with a stacked structure. During the etching process of a nano-gate, the difficulty of nano-gate etching control lies in the control on key parameters such as the gate or key dimensions.

SUMMARY

This disclosure relates to the field of semiconductors, and particularly relates to a method for manufacturing a semiconductor structure and the semiconductor structure manufactured by this method.

The technical problem to be solved by this disclosure is to provide a method for manufacturing a semiconductor structure and a semiconductor structure. Through the present disclosure, the deformation of a gate structure can be avoided and the reliability of a semiconductor device can be improved.

In order to solve the above problem, an embodiment of this disclosure provides a method for manufacturing a semiconductor structure. The method includes the following operations. A first conductive layer, a second conductive layer and a passivation layer are successively formed on a semiconductor substrate. The passivation layer and the second conductive layer are patterned to form a primary gate pattern, and a portion of the first conductive layer that is not covered by the primary gate pattern, is exposed. The primary gate pattern is subjected with plasma treatment to form a first protective layer on a side wall of the second conductive layer. A dielectric layer is formed on a side wall of the primary gate pattern and a side surface of the first protective layers. The exposed portion of the first conductive layer is removed to retain a portion of the first conductive layer covered by the primary gate patter. A second protective layer is formed on a side wall of the exposed portion of the first conductive layer, and the second protective layer and the dielectric layer serve as an isolation layer of the gate structure.

In an optional embodiment of this disclosure, patterning the passivation layer and the second conductive layer to form the primary gate pattern may further include the following operations. A mask layer and a photoresist layer are formed on the passivation layer. The photoresist layer is patterned, and the photoresist layer at a region where the primary gate pattern needs to be formed is retained. A pattern of the photoresist layer is transferred to the mask layer to form a patterned mask layer. The passivation layer and the second conductive layer are removed by taking the mask layer as a mask. And, the mask layer and the photoresist layer are removed to form the primary gate pattern.

In an optional embodiment of this disclosure, the primary gate pattern is subjected with plasma treatment by performing nitrogen and oxygen mixed plasma treatment on the side wall of the primary gate pattern.

In an optional embodiment of this disclosure, the primary gate pattern is subjected with plasma treatment by in-situ plasma treatment.

In an optional embodiment of this disclosure, the formation of the dielectric layers on the side wall of the primary gate pattern and the side surface of the first protective layer may further include the following operations. An initial dielectric layer is formed on a surface of the primary gate pattern and a surface of the exposed portion of the first conductive layer. Part of the initial dielectric layer is removed to retain a portion of the initial dielectric layer on the side wall of the primary gate pattern to serve as the dielectric layer.

In an optional embodiment of this disclosure, removing of the exposed portion of the first conductive layer to retain the portion of the first conductive layer located below the primary gate pattern may further include the following operations. The exposed portion of the first conductive layer is removed to expose the semiconductor substrate. The side wall of the first conductive layer is exposed, and a portion of the first conductive layer covered by the primary gate pattern and the first conductive layer below the dielectric layers on the side walls of the primary gate pattern are retained; and the first conductive layer below the dielectric layer on the side wall of the primary gate pattern is removed from the side wall of the first conductive layer, and the first conductive layer covered by the primary gate pattern is retained.

In an optional embodiment of this disclosure, the formation of the second protective layer on a side wall of the exposed portion of the first conductive layer is performed by epitaxially generating the second protective layer on the side wall of the exposed portion of the first conductive layer.

In an optional embodiment of this disclosure, a gate insulation layer is further formed on the semiconductor substrate. The gate insulation layer is located between the semiconductor substrate and the first conductive layer. After forming the second protective layer, the method may further include the following operations. The portion of gate insulation layer which is neither covered by the first conductive layer nor by the second protective layer is removed to expose the semiconductor substrate.

In an optional embodiment of this disclosure, a barrier layer is further formed between the first conductive layer and the second conductive layer. In the patterning of the passivation layer and the second conductive layer, the barrier layer is also patterned.

In an optional embodiment of this disclosure, after performing plasma treatment on the primary gate pattern, the method may further include a cleaning operation.

The embodiments of this disclosure further provide a semiconductor structure. The semiconductor structure includes: a semiconductor substrate; a gate structure located on the semiconductor substrate and including a first conductive layer, a second conductive layer and a passivation layer which are stacked; a first protective layer formed on a side wall of the second conductive layer by plasma treatment; a second protective layer covering a side wall of the first conductive layer; and a dielectric layer covering the first protective layer and a side wall of the passivation layer.

In an optional embodiment of this disclosure, the semiconductor structure may further include a gate insulation layer arranged between the semiconductor substrate and the gate structure.

In an optional embodiment of this disclosure, a side surface of the gate insulation layer is flush with an outer side surface of the second protective layer.

In an optional embodiment of this disclosure, a barrier layer is further arranged between the first conductive layer and the second conductive layer.

In an optional embodiment of this disclosure, side surfaces of the first conductive layer, the barrier layer, the first protective layer, and the passivation layer are flush.

In an optional embodiment of this disclosure, a thickness of the first protective layers is 3 angstroms to 20 angstroms.

In an optional embodiment of this disclosure, both the dielectric layer and the passivation layer are silicon nitride layer.

In an optional embodiment of this disclosure, an outer side surface of the second protective layer is flush with an outer side surface of the dielectric layer.

In an optional embodiment of this disclosure, the second protective layer is a silicide generated by an epitaxial reaction of polysilicon.

This disclosure has the following advantages. Specifically, the first protective layer is first formed on the surface of the gate structure, and then, an isolation layer is formed to prevent the gate structure from being oxidized. Therefore, the gate structure has a flat side wall structure, and is not deformed, thereby greatly improving the reliability of the semiconductor device, and the yield and performance of the final device.

REFERENCE SIGNS IN THE DRAWINGS

100: gate structure; 110: isolation layer;
200: semiconductor substrate;
300: gate insulation layer;
400: first conductive layer; 401: second protective layer; 402: structural layer;
500: barrier layer;
600: second conductive layer; 601: first protective layer;
700: passivation layer; 701: mask layer; 702: photoresist layer;
800: primary gate pattern;
900: initial dielectric layer; 901: dielectric layer.

DETAILED DESCRIPTION

In a manufacturing process of the metal/polysilicon gate, after a gate structure is formed by dry etching and before a protective layer is formed on a surface of the metal/polysilicon gate, the metal/polysilicon gate will be exposed, and the metal/polysilicon gate will be oxidized. The longer the metal/polysilicon gate is exposed, the more serious the oxidation will be. Subsequently, when the metal/polysilicon gate is subjected to wet cleaning by diluted HF, oxide layers on the metal side wall of the cannot be removed and are easy to form protrusions, while oxide layers on the polysilicon side wall can be removed and are easy to form recesses. This can cause uneven side wall with protrusions and recesses of the gate structure and deformation of the gate structure, and ultimately affect the electrical performance of the device and cause poor reliability of the semiconductor device, resulting in the loss of yield and performance of the final device.

Various embodiments of the present disclosure can address how to avoid the above situation.

The embodiments of a method for manufacturing a semiconductor structure and the semiconductor structure provided by this disclosure will be described in detail below with reference to the drawings.

This disclosure provides method for manufacturing a semiconductor structure, which can avoid the deformation of a gate structure and improve the reliability of a semiconductor device.

Figure 1:
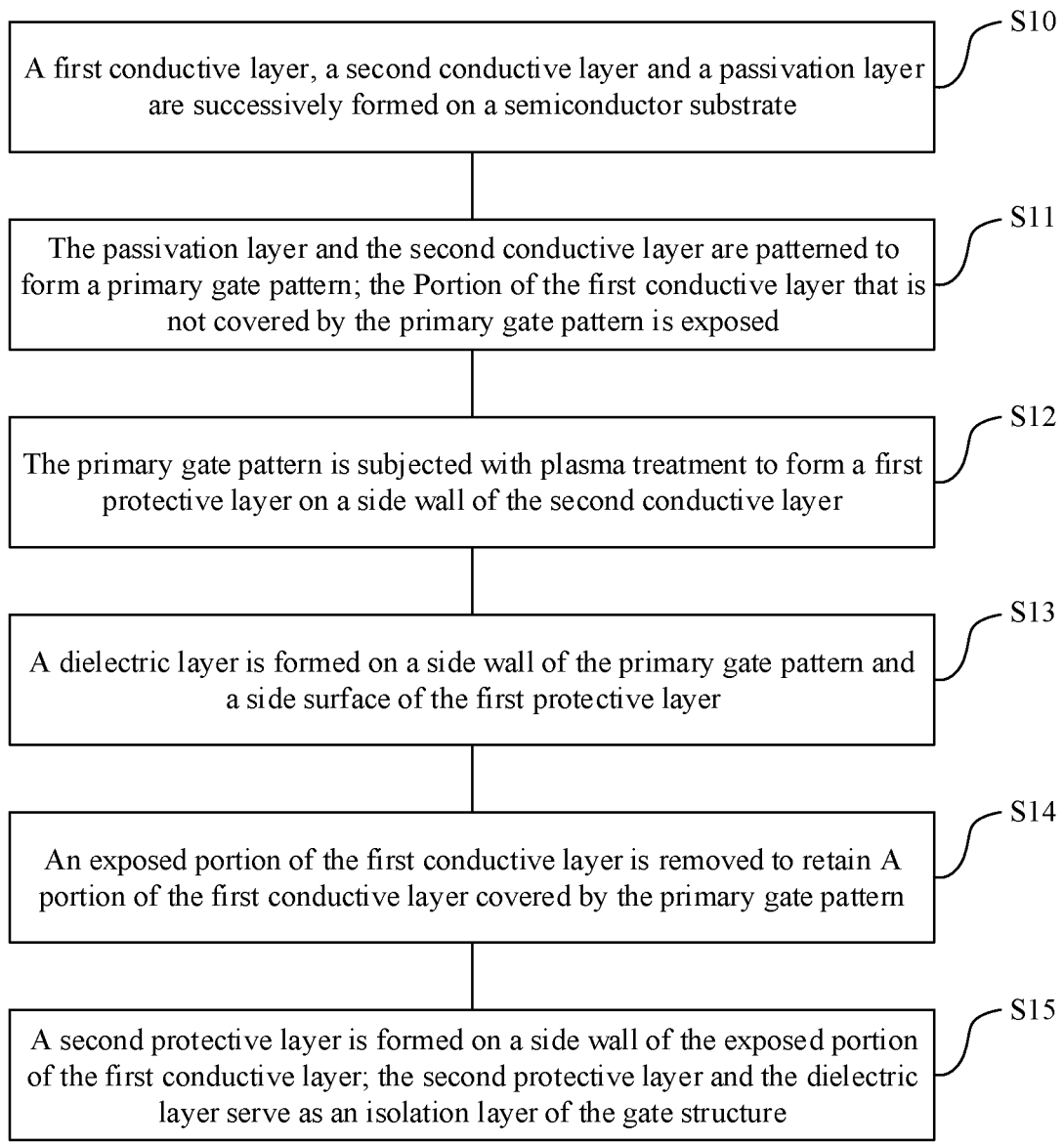
FIG. 1 schematically illustrates operations of a method for manufacturing a semiconductor structure according to one example of the disclosure.

FIG. 1 schematically illustrates operations of a method for manufacturing a semiconductor structure according to one example of the disclosure. Referring to FIG. 1, the method for manufacturing a semiconductor structure of the disclosure includes the following operations. At S10, a first conductive layer, a second conductive layer, and a passivation layer are successively formed on a semiconductor substrate. At S11, the passivation layer and the second conductive layer are patterned to form a primary gate pattern, and a region of the first conductive layer that is not shielded by the primary gate pattern, is exposed. At S12, plasma treatment is performed on the primary gate pattern to form a first protective layer on a side wall of the second conductive layer. At S13, a dielectric layer is formed on a side wall of the primary gate pattern and a side surface of the first protective layer. At S14, the exposed portion of the first conductive layer is removed to retain the first conductive layer covered by the primary gate pattern. And, at S15, a second protective layer is formed on a side wall of the exposed portion of the first conductive layer, and the second protective layer and the dielectric layer serve as an isolation layer of the gate structure.

FIG. 2 to FIG. 14 illustrate a flowchart of a method for preparing a semiconductor structure according to one example of the disclosure respectively.

Figure 2:
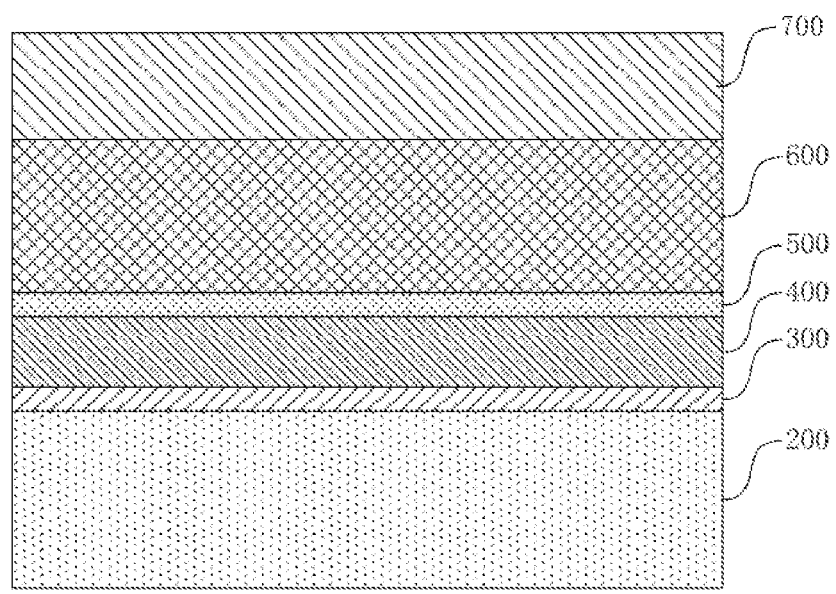
FIG. 2 illustrates a first flowchart of a method for manufacturing a semiconductor structure according to one example of the disclosure respectively.

Referring to S10 and FIG. 2, a first conductive layer 400, a second conductive layer 600 and a passivation layer 700 are successively formed on a semiconductor substrate 200. Further, in this example, a gate insulation layer 300 is further formed on the semiconductor substrate, and a barrier layer 500 is formed between the first conductive layer 400 and the second conductive layer 600.

The material of the semiconductor substrate 200 may be made of a material such as silicon (Si), germanium (Ge), silicon germanium (GeSi) or silicon carbide (SiC), may also be silicon-on-insulator (SOI) or germanium-on-insulator (GOI), or may also be other materials, such as other group III-V compounds (e.g., gallium arsenide). The semiconductor substrate 200 may be arranged with devices.

The gate insulation layer 300 may be made of silicon oxide, germanium oxide, etc. The gate insulation layer 300 may be formed on the semiconductor substrate 200 by means of such as thermal oxidation.

The first conductive layer 400 may be formed on the gate insulation layer 300 by processes such as chemical vapor deposition. The first conductive layer 400 is a conductive layer containing silicon, such as polysilicon. If the first conductive layer 400 is oxidized, the formed oxide can be easily removed by an etching solution.

The barrier layer 500 is configured to prevent the material of the second conductive layer 600 from diffusing to the first conductive layer 400. The barrier layer 500 may be formed by a chemical vapor deposition process or an atomic layer deposition process, and the material of the barrier layer 500 may be titanium nitride, tungsten nitride, or the like.

The second conductive layer 600 may be formed by a chemical vapor deposition process or a physical vapor deposition process. In this example, the second conductive layer 600 is a metal tungsten layer.

The passivation layer 700 may be formed by a chemical vapor deposition process or an atomic layer deposition process, and may be a silicon nitride (SiN) layer, a silicon boron nitride (SiBN) layer, or a silicon oxynitride (SiON) layer. In this example, the passivation layer 700 is a silicon nitride layer.

Referring to S11 and FIG. 3 to FIG. 7, the passivation layer 700 and the second conductive layer 600 are patterned to form a primary gate pattern 800, and a region of the first conductive layer 400 that is not shielded by the primary gate pattern 800, is exposed. It can be understood that in this operation, the barrier layer 500 is also patterned.

This example provides a method for forming the primary gate pattern 800.

Figure 3:
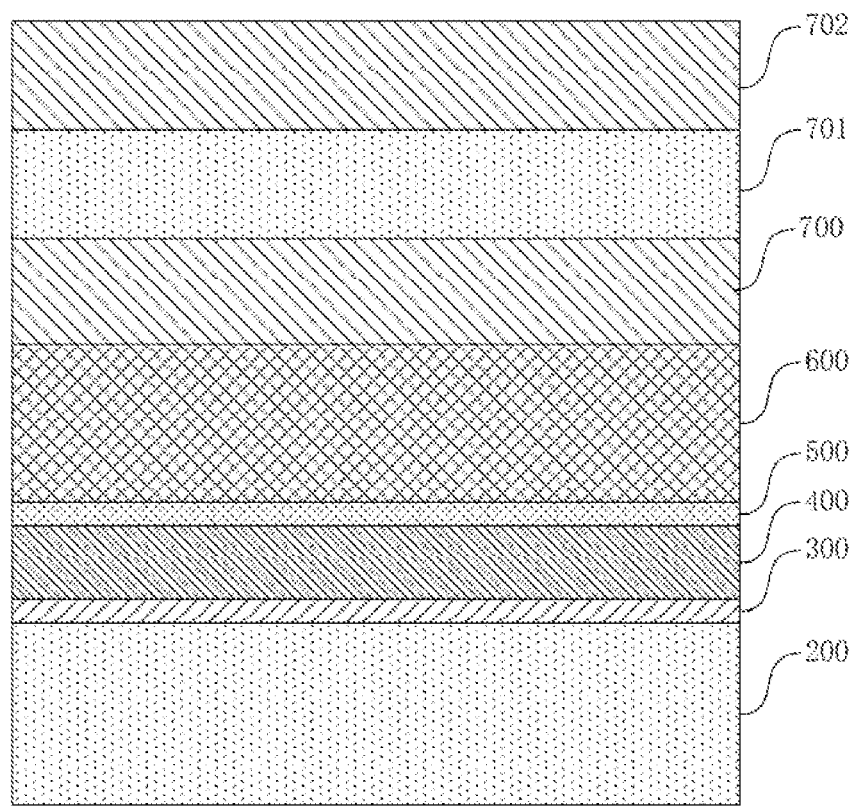
FIG. 3 illustrates a second flowchart of a method for manufacturing a semiconductor structure according to one example of the disclosure respectively.

Referring to FIG. 3, a mask layer 701 and a photoresist layer 702 are formed on the passivation layer 700. The mask layer 701 may include silicon oxynitride as a Dielectric Anti-Reflection Coating (DARC), and an amorphous carbon (a-C) layer as a pattern layer. In some examples, a Bottom Anti-Reflection Coating (BARC) and a Photo Resist (PR) may also be deposited on the mask layer 701. The photoresist layer 702 is formed on the BARC.

Figure 4:
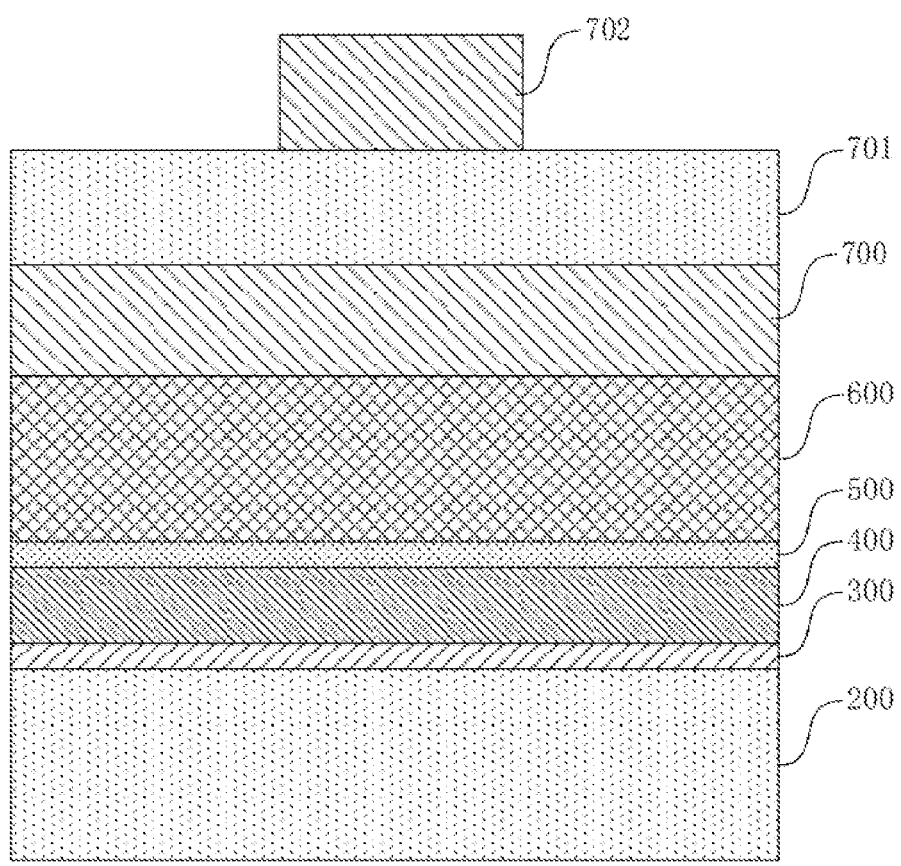
FIG. 4 illustrates a third flowchart of a method for manufacturing a semiconductor structure according to one example of the disclosure respectively.

Referring to FIG. 4, the photoresist layer 702 is patterned, and the photoresist layer located at the region where the primary gate pattern 800 needs to be formed is retained.

Figure 5:
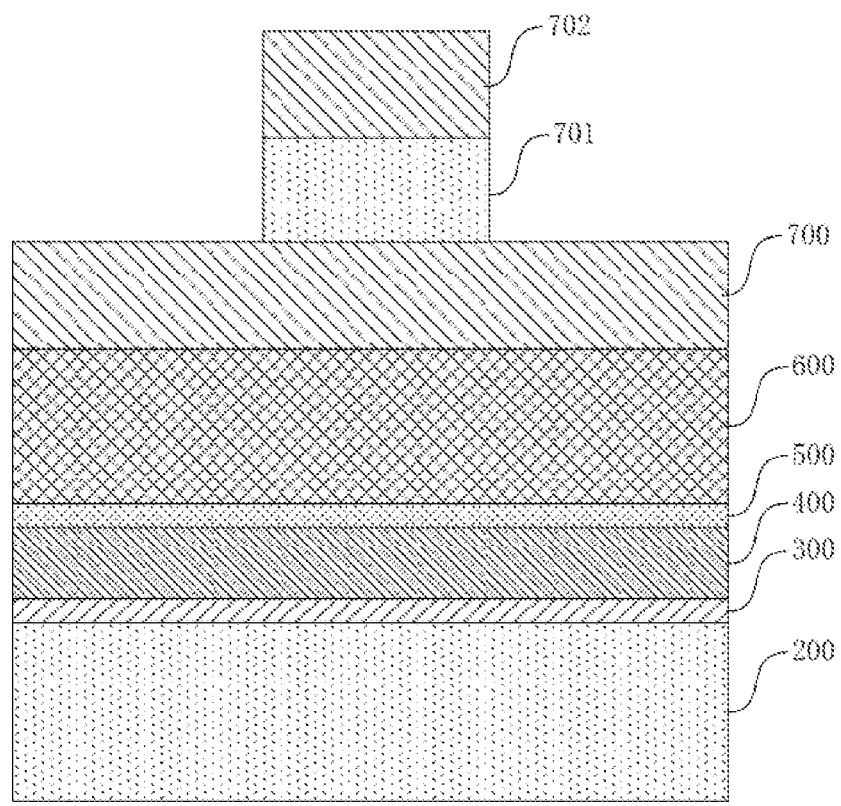
FIG. 5 illustrates a fourth flowchart of a method for manufacturing a semiconductor structure according to one example of the disclosure respectively.

Referring to FIG. 5, a pattern of the photoresist layer 702 is transferred to the mask layer 701 to form a patterned mask layer. A region shielded by the mask layer 701 is used as the region where the primary gate pattern 800 needs to be formed subsequently.

Figure 6:
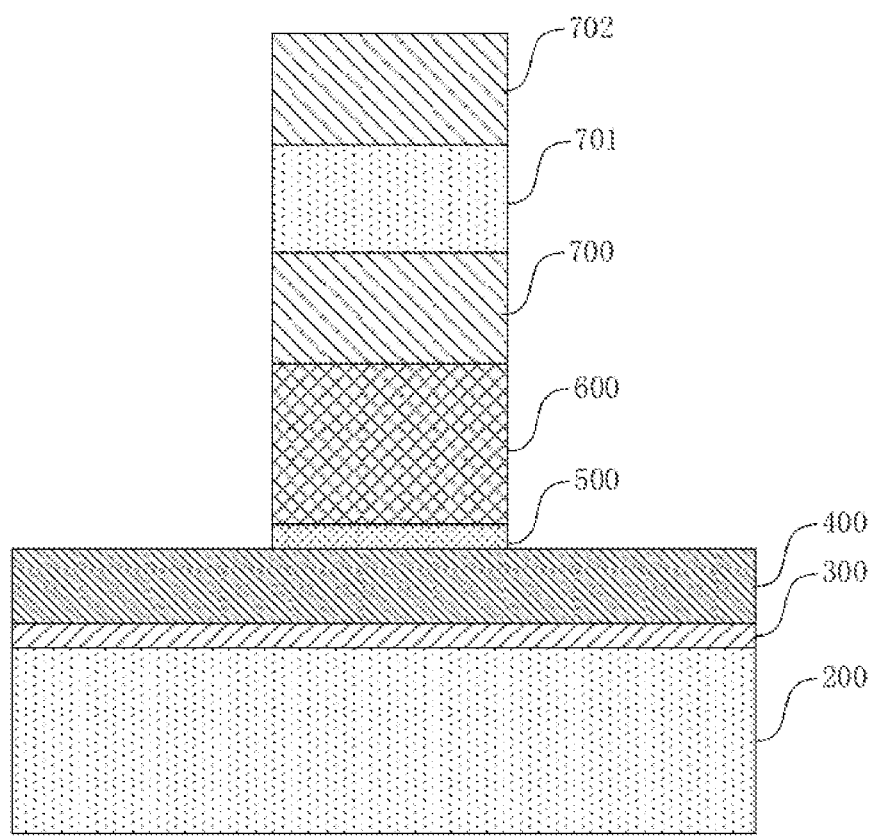
FIG. 6 illustrates a fifth flowchart of a method for manufacturing a semiconductor structure according to one example of the disclosure respectively.

Referring to FIG. 6, the passivation layer 700, the second conductive layer 600 and the barrier layer 500 are removed by taking the mask layer 701 as a mask. In this operation, the passivation layer 700, the second conductive layer 600 and the barrier layer 500 may be removed by a dry etching process. Portions of the passivation layer 700, the second conductive layer 600 and the barrier layer 500 shielded by the mask layer 701 are retained.

Figure 7:
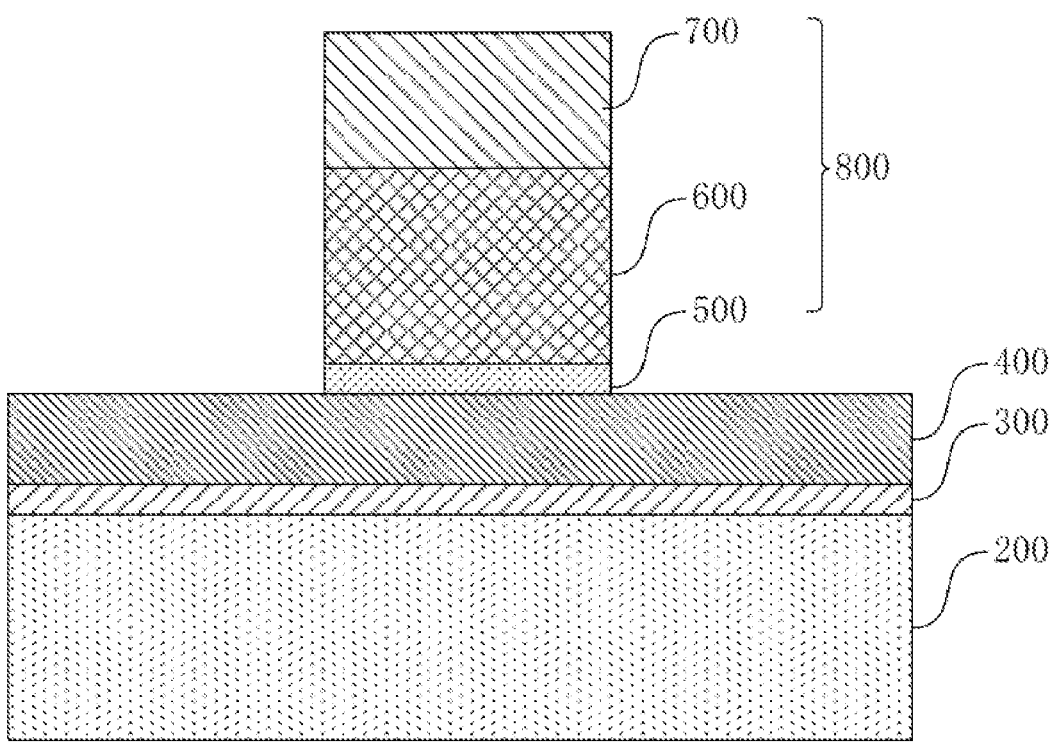
FIG. 7 illustrates a sixth flowchart of a method for manufacturing a semiconductor structure according to one example of the disclosure respectively.

Referring to FIG. 7, the mask layer 701 and the photoresist layer 702 are removed to form the primary gate pattern 800. It can be understood that during the above operations, the photoresist layer 702 and the mask layer 701 are also consumed, so that the remaining portions of the photoresist layer 702 and the mask layer 701 are removed in this operation.

Figure 8:
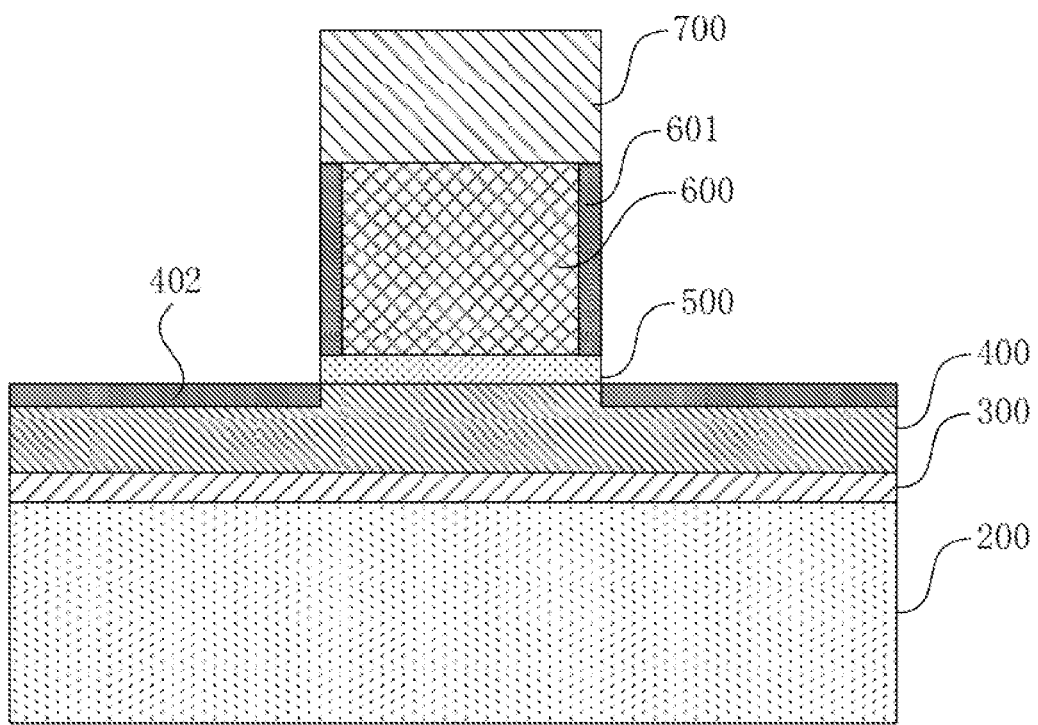
FIG. 8 illustrates a seventh flowchart of a method for manufacturing a semiconductor structure according to one example of the disclosure respectively.

Referring to S12 and FIG. 8, plasma treatment is performed on the primary gate pattern 800 to form a first protective layer 601 on the side wall of the second conductive layer 600. In this operation, on the side wall of the second conductive layer 600, the second conductive layer 600 reacts with plasma to form the first protective layer 601. For example, if the second conductive layer 600 is made of metal tungsten and the plasma is a mixture of nitrogen and oxygen, the first protective layer 601 containing nitrogen, oxygen, and tungsten is formed on the side wall of the second conductive layer 600. In the plasma, the content of oxygen is lower than the content of nitrogen, so as to facilitate the formation of the first protective layers 601. It can be understood that due to the limitation of the manufacturing process, during the plasma treatment, the first protective layers 601 are not formed only on the side wall of the second conductive layer 600 precisely, but the plasma treatment is also performed on the exposed surface of the first conductive layer 400 and the surfaces of the barrier layer 500 and the passivation layer 700 to form a structural layer. Since the structural layer formed on the surfaces of the barrier layer 500 and the passivation layer 700 are thinner, the structural layer is not shown in FIG. 8. In FIG. 8, only the first protective layer 601 and structural layer 402 on the surface of polysilicon are shown. Further, in this operation, plasma treatment on the side wall of the primary gate pattern is performed by in-situ plasma treatment. That is, plasma treatment is directly performed in a process chamber for forming the primary gate pattern. The primary gate pattern 800 formed at S11 can be prevented from being exposed for a long time, the side wall of the second conductive layer 600 can be prevented from being oxidized. Therefore, the side wall of the gate structure would not uneven, the gate structure cannot be deformed, thereby improving the reliability of the semiconductor device and improving the yield and performance of the final device.

Further, a thickness of the first protective layer 601 is 3 angstroms to 20 angstroms. If the first protective layer 601 is too thin, the purpose of preventing the second conductive layer 600 from being oxidized cannot be achieved. If the first protective layer 601 is too thick, the thickness of the second conductive layer 600 would be too small, which affects the resistance of the gate and thus the performance of the device.

Further, after S12 is performed, a cleaning operation is also included to remove by-products and the like generated in the plasma treatment. In this example, a solution used in the cleaning step is a diluted hydrofluoric acid solution. In other examples of this disclosure, other cleaning solutions may be used.

Figure 10:
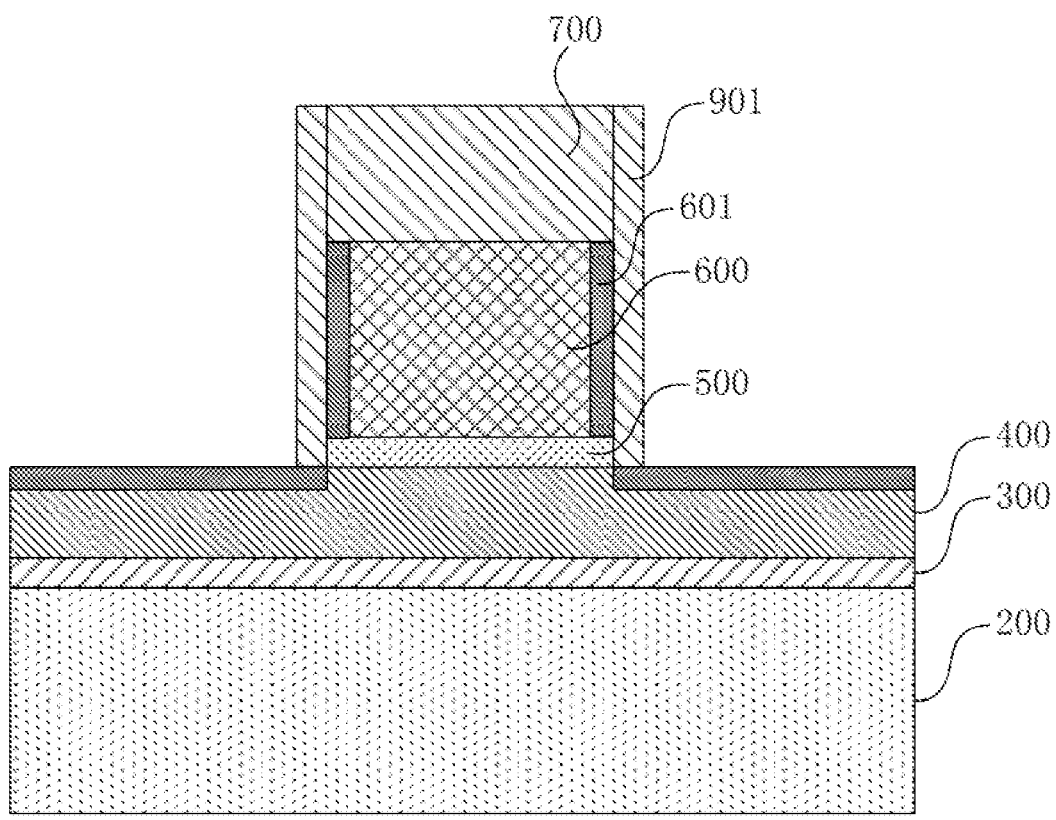
FIG. 10 illustrates a ninth flowchart of a method for manufacturing a semiconductor structure according to one example of the disclosure respectively.

Referring to S13 and FIG. 10, a dielectric layer 901 is formed on the side wall of the primary gate pattern 800 and the side surface of the first protective layer 601.

A method for forming the dielectric layers 901 is provided in this example. The method is specifically described as follows.

Figure 9:
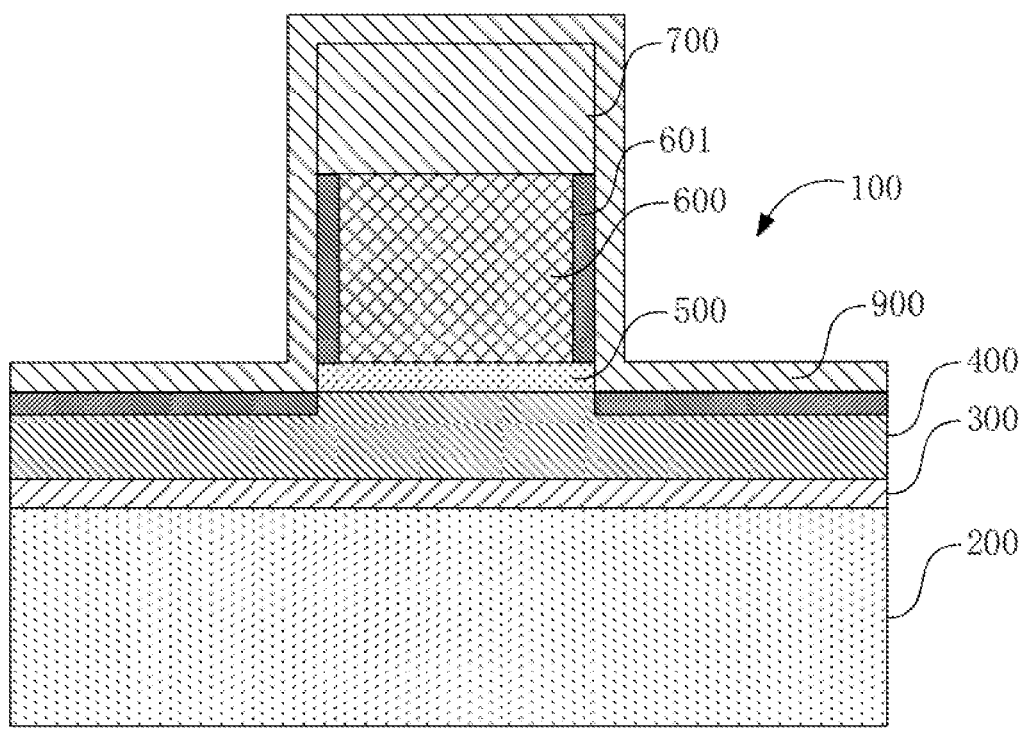
FIG. 9 illustrates an eighth flowchart of a method for manufacturing a semiconductor structure according to one example of the disclosure respectively.

Referring to FIG. 9, an initial dielectric layer 900 is formed on the surface of the primary gate pattern 800 and the surface of the exposed portion of the first conductive layer 400. In this operation, the initial dielectric layer 900 may be formed by a chemical vapor deposition process or an atomic layer deposition process. The initial dielectric layer 900 may be a silicon nitride (SiN) layer, a silicon boron nitride (SiBN) layer, or a silicon oxynitride (SiON) layer. In this example, the initial dielectric layer 900 is a silicon nitride layer. The initial dielectric layer 900 covers the upper surface and the side wall of the primary gate pattern 800 and the surface of the exposed portion of the first conductive layer 400.

Referring to FIG. 10, part of the initial dielectric layer 900 is removed to retain portion of the initial dielectric layer on the side wall of the primary gate pattern 800 to serve as the dielectric layers 901. Specifically, the portion of the initial dielectric layer 900 covering the first conductive layer 400 is removed by dry etching, and thus the portion of the initial dielectric layer on the side wall of the primary gate pattern 800 is retained. In this operation, the portion of the initial dielectric layer 900 on the upper surface of the primary gate pattern 800 is also removed.

Figure 12:
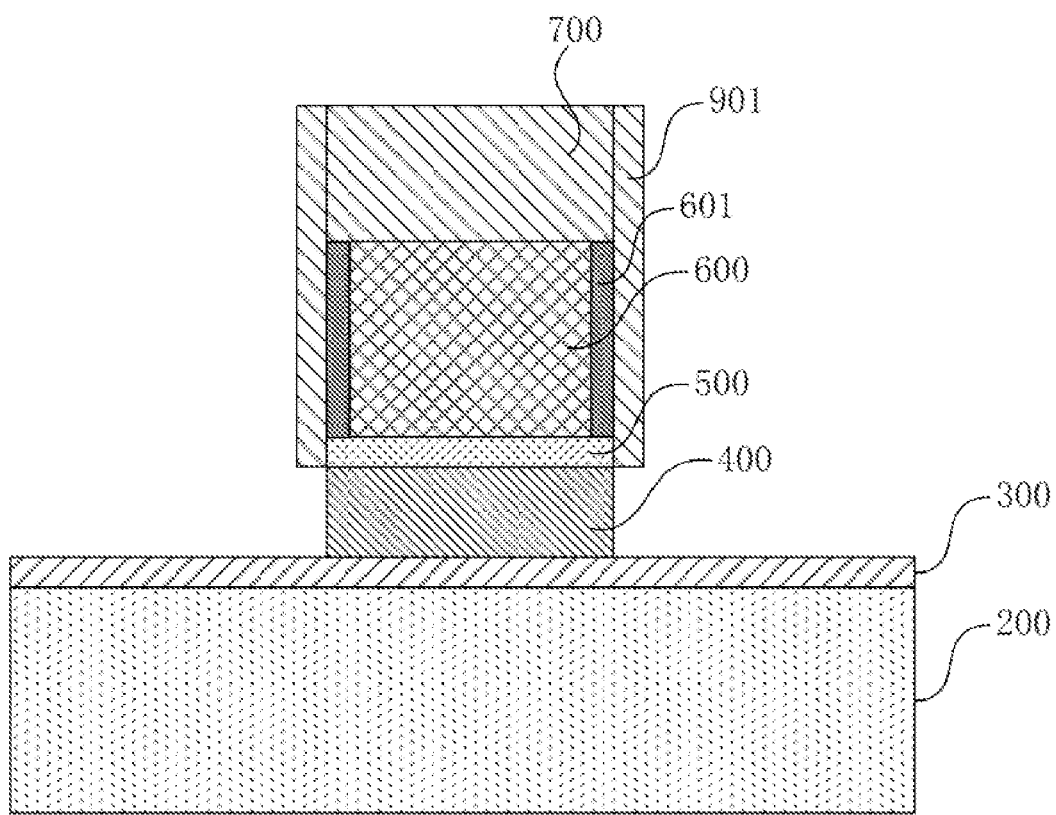
FIG. 12 illustrates an eleventh flowchart of a method for manufacturing a semiconductor structure according to one example of the disclosure respectively.

Referring to S14 and FIG. 12, the exposed portion of the first conductive layer 400 is removed to retain the portion of the first conductive layer 400 covered by the primary gate pattern 800.

Specifically, in this example, this operation is performed as follows.

Figure 11:
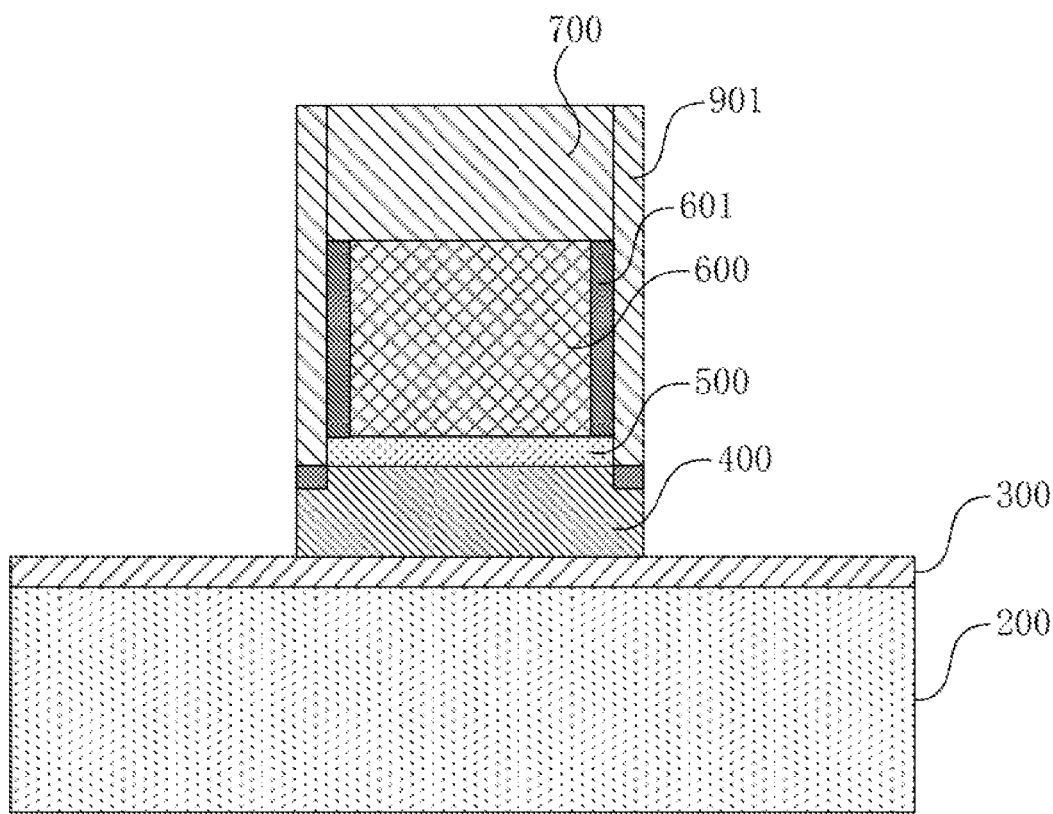
FIG. 11 illustrates a tenth flowchart of a method for manufacturing a semiconductor structure according to one example of the disclosure respectively.

Referring to FIG. 11, the exposed portion of the first conductive layer 400 is removed by dry etching to expose the gate insulation layer 300 and the side wall of the first conductive layer 400, as well as to retain the portion of the first conductive layer 400 covered by the primary gate pattern 800 and the portion of the first conductive layer 400 below the dielectric layer 901 on the side wall of the primary gate pattern 800.

Referring to FIG. 12, the portion of the first conductive layer 400 below the dielectric layers 901 on the side wall of the primary gate pattern 800 is removed from the side wall of the first conductive layer 400 by an isotropic etching process, to retain the portion of the first conductive layer 400 covered by the primary gate pattern 800. After this operation, the side wall of the first conductive layer 400 is flush with the outer side surface of the first protective layer 601.

The second conductive layer 600, the barrier layer 500 and the first conductive layer 400 serve as a gate structure 100.

Figure 13:
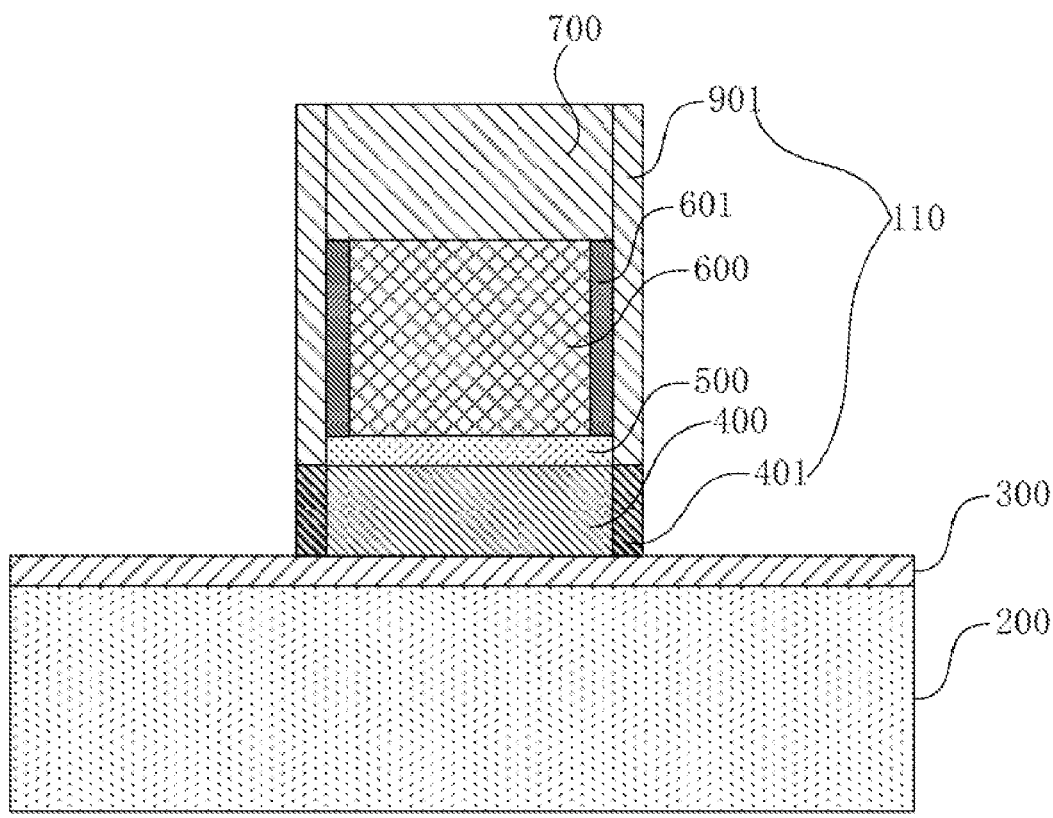
FIG. 13 illustrates a twelfth flowchart of a method for manufacturing a semiconductor structure according to one example of the disclosure respectively.

Referring to S15 and FIG. 13, a second protective layer 401 is formed on the side wall of the exposed portion of the first conductive layer 400. The second protective layer 401 and the dielectric layer 901 serve as an isolation layer 110 of the gate structure 100.

Specifically, in this example, SiC is formed on the side wall of the exposed portion of the first conductive layer 400 by means of epitaxial growth, and can be used as the second protective layer 401. By means of epitaxial growth, the structural layer can be controllably grown only on the side wall of the exposed portion of the first conductive layer 400, but no structural layer is grown on the surfaces of the gate insulation layer 300 and the dielectric layer 901. In this way, subsequent operations of removing the structural layer on the surface of the gate insulation layer 300 and the dielectric layer 901 can be avoided, thereby simplifying the process and saving the process cost. In addition, the compactness of SiC formed by means of epitaxial growth is better than the compactness of silicon oxide formed by processes such as thermal oxidation, so as to play a good blocking role to prevent the first conductive layer 400 from being damaged in the subsequent processes.

After this operation, the outer side surface of the second protective layer 401 is flush with the outer side surface of the dielectric layer 901.

Figure 14:
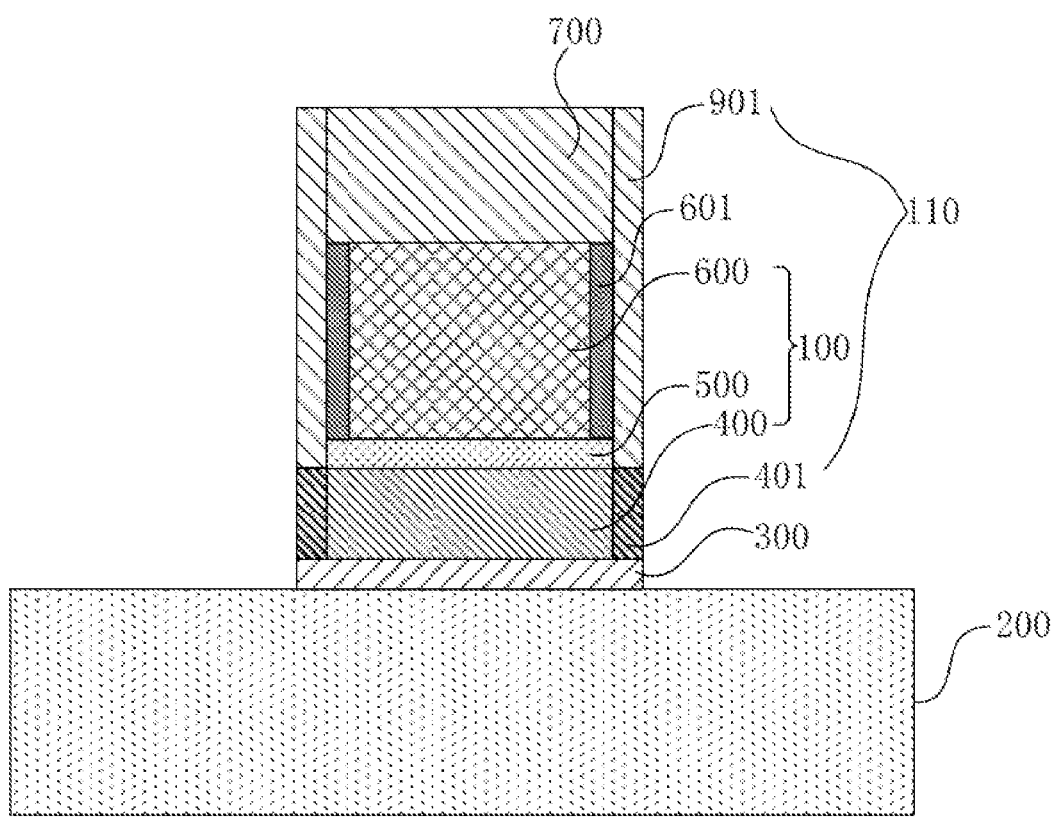
FIG. 14 illustrates a thirteenth flowchart of a method for manufacturing a semiconductor structure according to one example of the disclosure respectively.

Further, in this example, the method further includes an operation of removing the gate insulation layer. Referring to FIG. 14, the portion of the gate insulation layer 300 that is not covered by the gate structure 100 and the isolation layers 110 is removed to expose the semiconductor substrate 200. The gate insulation layer 300 may be removed by a dry etching process.

After the structure shown in FIG. 14 is formed, the semiconductor structure can be subjected with re-oxidized treatment to improve the reliability of the gate insulation layer 300. During the re-oxidation treatment, the isolation layer 110 can protect the gate structure from being oxidized.

The method for manufacturing the semiconductor structure of this disclosure can prevent the gate structure from being oxidized, thereby avoiding the deformation of the gate structure, and improving the reliability of the semiconductor device.

This disclosure further provides a semiconductor structure manufactured by the above method. Referring to FIG. 14, the semiconductor structure includes a semiconductor substrate 200, a gate structure 100 and isolation layer 110.

In this example, the semiconductor structure further includes a gate insulation layer 300, and the gate insulation layer 300 is arranged between the semiconductor substrate 200 and the gate structure 100.

The material of the semiconductor substrate 200 may be silicon (Si), germanium (Ge), silicon germanium (GeSi) or silicon carbide (SiC), may also be silicon-on-insulator (SOI) or germanium-on-insulator (GOI), or may also be other materials, such as gallium arsenide and other group III-V compounds. The semiconductor substrate 200 may also be arranged with devices.

The gate insulation layer 300 is arranged on the semiconductor substrate 200 and can be used as an insulation layer between the semiconductor substrate 200 and the gate structure 100. In this example, only the surface of the semiconductor substrate 200 corresponding to the gate structure 100 and the isolation layer 110 is covered by the gate insulation layer 300, but other region thereof is not covered by the gate insulation layer 300.

The gate structure 100 is arranged on the gate insulation layer 300. The gate structure 100 includes a first conductive layer 400, a barrier layer 500, a second conductive layer 600 and a passivation layer 700 which are arranged in sequence. The first protective layer 601 formed by plasma treatment is arranged on the side wall of the second conductive layer 600. The first conductive layer 400 is in contact with the gate insulation layer 300.

The isolation layer 110 is formed on the side wall of the gate structure 100. The isolation layer 110 is composed of the second protective layer 401 covering the first conductive layer 400 and the dielectric layer 901 covering the barrier layer 500, the first protective layer 601 and the passivation layer 700. The dielectric layer 901 and the passivation layer 700 may be made of the same material, such as a silicon nitride material. The second protective layer 401 is made of a silicide generated by an epitaxial reaction of polysilicon.

Further, in this example, the side surface of the gate insulation layer 300 is flush with the outer side surface of the isolation layer 110. That is, the gate insulation layer 300 is only located below the isolation layer 110 and the gate structure 100. It can be understood that in other examples of this disclosure, the width of the gate insulation layer 300 is greater than the width of the isolation layer 110 and the width of the gate structure 100. That is, the gate insulation layer 300 is not only located below the isolation layer 110 and the gate structure 100, but also located in a part of the region other than below the isolation layer 110 and the gate structure 100.

The side surfaces of the first conductive layer 400, the barrier layer 500, the first protective layer 601 and the passivation layer 700 are flush, so that the gate structure 100 is a structure having a flat side surface, thereby avoiding the uneven side surface, and greatly improving the reliability of the semiconductor device.

Further, the thickness of the first protective layer 601 is 3 angstroms to 20 angstroms. If the first protective layer 601 is too thin, the purpose of preventing the second conductive layer 600 from being oxidized cannot be achieved. If the first protective layer 601 is too thick, the thickness of the second conductive layer 600 is too small, which affects the resistance of the gate and further affects the performance of the device.

Further, the outer side surfaces of the second protective layer 401 and the dielectric layer 901 are flush. That is, the outer side surface of the isolation layer 110 is of a flat structure, and the uneven condition is avoided.

The side wall of the gate structure of the semiconductor structure of this application is flat, the gate structure is not deformed, the reliability of the semiconductor device is greatly improved, and the yield and performance of the final device are further improved.

The above embodiments are only optional embodiments of this disclosure. It should be noted that those skilled in the art can make several improvements and modifications without departing from the principles of this disclosure, and these improvements and modifications should also be regarded as within the protection scope of this disclosure.

What is claimed is:

1. A method for manufacturing a semiconductor structure, comprising:
    successively forming a first conductive layer, a second conductive layer and a passivation layer on a semiconductor substrate;
    patterning the passivation layer and the second conductive layer to form a primary gate pattern, wherein a portion of the first conductive layer that is not covered by the primary gate pattern is exposed;
    subjecting the primary gate pattern with plasma treatment to form a first protective layer on a side wall of the second conductive layer;
    forming a dielectric layer on a side wall of the primary gate pattern and a side surface of the first protective layer;
    removing the exposed portion of the first conductive layer to retain a portion of the first conductive layer covered by the primary gate pattern; and
    forming a second protective layer on a side wall of the exposed portion of the first conductive layer, wherein the second protective layer and the dielectric layer serve as an isolation layer of the gate structure.

2. The method for manufacturing the semiconductor structure of claim 1, wherein said patterning the passivation layer and the second conductive layer to form the primary gate pattern further comprises:
    forming a mask layer and a photoresist layer on the passivation layer;
    patterning the photoresist layer, wherein the photoresist layer at a region where the primary gate pattern needs to be formed is retained;
    transferring the pattern of the photoresist layer to the mask layer to form a patterned mask layer;
    removing the passivation layer and the second conductive layer by taking the mask layer as a mask; and
    removing the mask layer and the photoresist layer to form the primary gate pattern.

3. The method for manufacturing the semiconductor structure of claim 1, wherein the primary gate pattern is subjected with plasma treatment by performing nitrogen and oxygen mixed plasma treatment on the side wall of the primary gate pattern.

4. The method for manufacturing the semiconductor structure of claim 1, wherein the primary gate pattern is subjected with plasma treatment by in-situ plasma treatment.

5. The method for manufacturing the semiconductor structure of claim 1, wherein the formation of the dielectric layer on the side wall of the primary gate pattern and the side surface of the first protective layer further comprises:
    forming an initial dielectric layer on a surface of the primary gate pattern and a surface of the exposed portion of the first conductive layer; and
    removing part of the initial dielectric layer to retain a portion of the initial dielectric layer on the side wall of the primary gate pattern to serve as the dielectric layer.

6. The method for manufacturing the semiconductor structure of claim 5, wherein said removing the exposed portion of the first conductive layer to retain the portion of the first conductive layer located below the primary gate pattern further comprises:
    removing the exposed portion of the first conductive layer to expose the semiconductor substrate, wherein a side wall of the first conductive layer is exposed, and a portion of the first conductive layer covered by the primary gate pattern and the first conductive layer below the dielectric layer on the side wall of the primary gate pattern are retained; and
    removing the first conductive layer below the dielectric layer on the side wall of the primary gate pattern from the side wall of the first conductive layer, wherein the first conductive layer covered by the primary gate pattern is retained.

7. The method for manufacturing the semiconductor structure of claim 1, wherein the formation of the second protective layer on a side wall of the exposed portion of the first conductive layer is performed by epitaxially generating the second protective layer on the side wall of the exposed portion of the first conductive layer.

8. The method for manufacturing the semiconductor structure of claim 1, further comprising, forming a gate insulation layer on the semiconductor substrate, wherein the gate insulation layer is located between the semiconductor substrate and the first conductive layer, and after forming the second protective layers, further comprising: removing the gate insulation layer which is neither covered by the first conductive layer nor by the second protective layer to expose the semiconductor substrate.

9. The method for manufacturing the semiconductor structure of claim 1, further comprising, forming a barrier layer between the first conductive layer and the second conductive layer, and wherein in the patterning of the passivation layer and the second conductive layer, the barrier layer is also patterned.

10. The method for manufacturing the semiconductor structure of claim 1, further comprising, a cleaning operation, after performing plasma treatment on the primary gate pattern.

11. A semiconductor structure, comprising:
a semiconductor substrate;
a gate structure located on the semiconductor substrate, wherein the gate structure comprises a first conductive layer, a second conductive layer and a passivation layer which are stacked, and a first protective layer formed by plasma treatment are arranged on a side wall of the second conductive layer;
a second protective layer covering a side wall of the first conductive layer; and
a dielectric layer covering side walls of the first protective layer and the passivation layer;
wherein an outer side surface of the second protective layer is flush with an outer side surface of the dielectric layer.

12. The semiconductor structure of claim 11, further comprising a gate insulation layer arranged between the semiconductor substrate and the gate structure.

13. The semiconductor structure of claim 11, wherein a barrier layer is further arranged between the first conductive layer and the second conductive layer.

14. The semiconductor structure of claim 13, wherein side surfaces of the first conductive layer, the barrier layer, the first protective layer, and the passivation layer are flush.

15. The semiconductor structure of claim 11, wherein a thickness of the first protective layer is 3 angstroms to 20 angstroms.

16. The semiconductor structure of claim 11, wherein both the dielectric layer and the passivation layer are silicon nitride layers.

17. The semiconductor structure of claim 11, wherein the second protective layer is a silicide generated by an epitaxial reaction of polysilicon.

18. A semiconductor structure, comprising:
a semiconductor substrate;
a gate structure located on the semiconductor substrate, wherein the gate structure comprises a first conductive layer, a second conductive layer and a passivation layer which are stacked, and a first protective layer formed by plasma treatment are arranged on a side wall of the second conductive layer;
a second protective layer covering a side wall of the first conductive layer;
a dielectric layer covering side walls of the first protective layer and the passivation layer; and
a gate insulation layer arranged between the semiconductor substrate and the gate structure;
wherein a side surface of the gate insulation layer is flush with an outer side surface of the second protective layer.

* * * * *